AMPLIFIER CIRCUIT INCLUDING A LOSSLESS TRANSMISSION LINE

Filed May 5, 1969

INVENTOR.
TORE TORSTENSSON FJÄLLBRANT
BY
Hane and Baxley
ATTORNEYS

United States Patent Office 3,514,711

Patented May 26, 1970

3,514,711
AMPLIFIER CIRCUIT INCLUDING A LOSSLESS TRANSMISSION LINE

Tore Torstensson Fjällbrant, Fjaras, Sweden, assignor to Telefonaktiebolaget L M Ericsson, Stockholm, Sweden, a corporation of Sweden Continuation-in-part of application Ser. No. 569,628, Aug. 2, 1966. This application May 5, 1969, Ser. No. 821,621

Int. Cl. H03f *3/60, 21/00*

U.S. Cl. 330—53 4 Claims

ABSTRACT OF THE DISCLOSURE

An amplifier circuit comprises an amplifier device interconnected with a lossless transmission line. The characteristic impedance and the length of the transmission line are chosen to neutralize any variations of the amplifier device with frequency and ambient conditions.

SPECIFICATION

The present invention relates to amplifier circuits and is a continuation-in-part of pending application Ser. No. 569,628, filed Aug. 2, 1966 now abandoned.

BACKGROUND

In amplifier circuits it has been proposed to utilize negative feed-back to provide a method for decreasing the sensitivity of the amplifiers to the active parameters at the expense of the degree of amplification. It would be desirable to have an amplifier circuit in which the loss of amplification is avoided but in which, in spite of this, the sensitvitiy of the amplification with respect to variations in the value of the active parameter of the amplifier element included in the circuit is decreased to a minimum. Such a result requires the first derivative of the parameter curve to be zero at the chosen operating point.

THE INVENTION

An object of the invention is to provide such a circuit with an amplification which, for a certain operating point, is substantially independent of variations in the active parameter of included amplifier elements, that is, the one parameter out of the four in the impedance matrix of the amplifier which determines the amplification of the amplifier. For transistors, this parameter is, for example, the current amplification factor $h_{21}$, which is dependent on frequency and on such factors of the environment as operating voltage and ambient temperature.

The value of the active parameter is dependent on the frequency, and also on factors of the environment, such as, for example, voltage and temperature. The active parameter varies in different ways as a function of frequency and as a function of environment. Often the real part of a complex parameter varies with a change in frequency and the imaginary part with a change in environment or vice versa. As, in such a case, the value of the active parameter varies from the value at the operating point, upon a change in frequency and constant environment as well as upon a change in environment and constant frequency it would be desirable to have a decrease of the amplification upon variation of both these types.

Briefly, the invention contempltaes stabilizing an amplifier circuit by connecting the input and output terminals of an amplifier element to a substantially loss-free transmission line having the impedance matrix.

$$Z=\begin{bmatrix} jZ_0 \cot \phi & -jZ_0 \frac{1}{\sin}\phi \\ -jZ_0 \frac{1}{\sin}\phi & -jZ_0 \cot \end{bmatrix}$$

which satisfies the following matrix equation:

$$\begin{pmatrix} V_1 \\ V_2 \end{pmatrix}=\begin{bmatrix} -jZ_0 \cot \phi & -jZ_0 \frac{1}{\sin}\phi \\ -jZ_0 \frac{1}{\sin}\phi & -jZ_0 \cot \phi \end{bmatrix}\begin{pmatrix} I_1 \\ I_2 \end{pmatrix}$$

where $V_1$ is the input voltage of the transmission line, $V_2$ its output voltage, $I_1$ its input current and $I_2$ its output current, $Z_0$ is the characteristic impedance of the line and $\phi$ is its length. The elements in the impedance matrix are chosen in such a way that the amplification of the amplifier circuit, given by the expression:

$$K_{21}=\frac{4z_a z_b z_{21}^2}{[(z_{11}+z_a)(z_{22}+z_b)-z_{12}z_{21}]^2}$$

where $z_{11}$, $z_{12}$, $z_{21}$ and $z_{22}$ are the impedance parameters of the amplifier circuits, and $z_a$ and $z_b$ are the load impedances on the input and output side, respectively, of the amplifier circuit, has a maximum for the value of the active parameter of the amplifier prevailing at the operating point. In other words, the derivative of $K_{21}$ with respect to the active parameter is zero at this point.

The invention will now be described more in detail in connection with the accompanying drawing in which.

Figure 1:
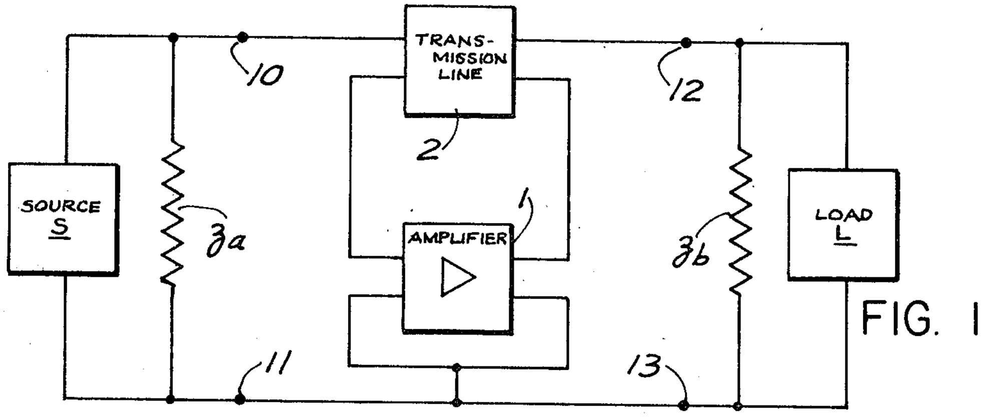
FIG. 1 is a diagram showing an amplifier element connected in series with a transmission line.

As known in the prior art, a linear four-terminal network can be characterized by a signal transfer matrix comprising four parameter elements. These elements may, for example, be impedances whereby the following so-called impedance matrix of the four-terminal network is obtained.

$$Z=\begin{pmatrix} z_{11} z_{12} \\ z_{21} z_{22} \end{pmatrix}$$

which satisfies the matrix equation $$\begin{pmatrix} V_1 \\ V_2 \end{pmatrix}=\begin{pmatrix} z_{11} z_{12} \\ z_{21} z_{22} \end{pmatrix}\begin{pmatrix} I_1 \\ I_2 \end{pmatrix}$$

in which $V_1$ is the input voltage of the four terminal network, $V_2$ its output voltage, $I_1$ its input current, $I_2$ its output current. In a corresponding way the admittance matrix of the four-terminal network is $$Y=\begin{pmatrix} y_{11} y_{12} \\ y_{21} y_{22} \end{pmatrix}$$

which satisfies the matrix equation $$\begin{pmatrix} I_1 \\ I_2 \end{pmatrix}=\begin{pmatrix} y_{11} y_{12} \\ y_{21} y_{22} \end{pmatrix}\begin{pmatrix} V_1 \\ V_2 \end{pmatrix}$$

Similarly, the hybrid matrix is $$H=\begin{pmatrix} h_{11} h_{12} \\ h_{21} h_{22} \end{pmatrix}$$

which satisfies the matrix equation $$\begin{pmatrix} V_1 \\ I_2 \end{pmatrix}=\begin{pmatrix} h_{11} h_{12} \\ h_{21} h_{22} \end{pmatrix}\begin{pmatrix} I_1 \\ V_2 \end{pmatrix}$$

These signal transfer matrices are linearly related, i.e., from one of the matrices any of the other can be easily obtained. By means of the elements in the impedance matrix the amplification $K_{21}$ of the four-terminal network can be obtained from the expression:

$$K_{21}=\frac{4z_az_bz_{21}^2}{[(z_{11}+z_a)(z_{22}+z_b)-z_{12}z_{21}]^2}$$

where $z_a$ is the load impedance connected to the input side of the network and $z_b$ is the load impedance connected to the output side of the network. If the four-terminal network is only an amplifier device, the signal transfer matrix can be represented by $$A=\begin{pmatrix}A_{11}A_{22}\\A_{21}A_{22}\end{pmatrix}$$

And if the amplifier device is, for example a transistor, the impedance matrix can generally be approximated as $$Z_f=\begin{pmatrix}0 & 0\\z_{21f} & 0\end{pmatrix}$$

the admittance matrix is approximated as $$Y_f=\begin{pmatrix}0 & 0\\y_{21f} & 0\end{pmatrix}$$

and the hybrid matrix is approximated as $$H_f=\begin{pmatrix}0 & 0\\h_{21f} & 0\end{pmatrix}$$

The amplification will then be $$K_{21f}=\frac{4z_{21f}^2}{z_az_b}$$

As appears from this expression the amplification will be proportional to the square of parameter $z_{21f}$, the so-called active parameter which determines the amplification of the amplifier. When this parameter varies because of frequency and environment changes the derivative of the amplification $K_{21f}$ with respect to this parameter cannot be made equal to zero. If however a lossless transmission line is connected in series with the amplifier device wherein the impedance matrix of the transmission line is $$Z_t=\begin{pmatrix}-jZ_0\cot\phi & -jZ_0\frac{1}{\sin}\phi\\-jZ_0\frac{1}{\sin}\phi & -jZ_0\cot\phi\end{pmatrix}$$

where $Z_0$ is the characteristic impedance of the line and $\phi$ is the electric length of the line, i.e., $\phi=(\omega\sqrt{lc})d$, where $\omega$ is the frequency, $d$ the length of the line and $l$ and $c$ the inductance and capacitance, respectively, of the line per unit length, a four-terminal network is obtained wherein the elements of the impedance matrix are the matrix sum of the respective impedance parameters of the amplifier and tranmsission line. It should be noted that the admittance and hybrid matrices of the transmission line can be obtained by conventional matrix algebra from the impedance matrix thereof. Thus, the impedance matrix $$A+Z_t=Z_f+Z_t=\begin{pmatrix}-jZ_0\cot\phi & -jZ_0\frac{1}{\sin}\phi\\z_{21f}-jZ_0\frac{1}{\sin}\phi & -jZ_0\cot\phi\end{pmatrix}$$

is obtained when the amplifier device is a transistor, whereby the amplification will be $$K_{21}=\frac{4Z_aZ_b\left(z_{21f}-jZ_0\frac{1}{\sin}\phi\right)^2}{\left[(-jZ_0\cot\phi+Z_a)(-jZ_0\cot\phi+Z_b)-\left(z_{21f}-jZ_0\frac{1}{\sin}\phi\right)\left(-jZ_0\frac{1}{\sin}\phi\right)\right]^2}$$

The characteristic impedance $Z_0$ and electric length $\phi$ of the transmission line are chosen in such a way that the derivaitve of amplification factor $K_{21}$ with respect to parameter $z_{21f}$ will be zero for the value of parameter $x_{21f}$ at the selected operating point. This amplifier circuit is shown in FIG. 1, where reference character 1 indicates an amplifier element and reference character 2 indicates a loss free transmission line. One input of the transmission line and one input of the amplifier element are connected to the input terminals 10 and 11, respectively, of the amplifier circuit which are connected to source S having output impedance $z_a$. The other inputs of the amplifier element and of the line, respectively, are interconnected. In a similar way one output of the amplifier element 1 and one output of the line 2 are interconnected and the other outputs are connected to the output terminals 12 and 13, respectively, of the circuit which are connected to load L having impedance $z_b$.

Figure 2:
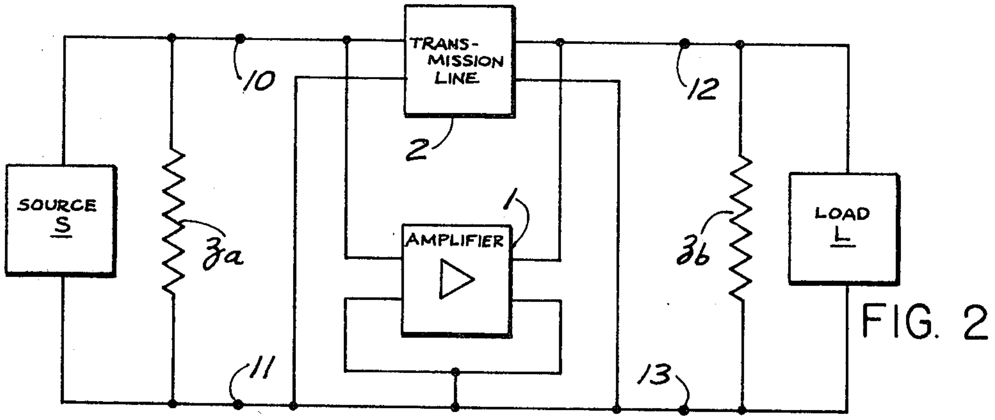
FIG. 2 is a diagram showing the amplifier element connected in parellel with the transmission line.

In a corresponding way it is possible to achieve, by connecting in parallel the amplifier element and the transmission line, an amplification factor $K_{21}$, the derivative of which with respect to the active parameter $z_{21f}$ will be zero at a desired operating point. The expression for the amplification is then obtained by adding the admittance matrices of the transmission line and the amplifier element. This admittance can be transformed to the corresponding impedance matrix. Such an amplifier circuit is shown in FIG. 2, in which the respective inputs of the transmission line 2 and the amplifier element 1 are connected in parallel to the input terminals 10 and 11 which are connected to source S with output impedance $z_a$ and their respective outputs are connected in parallel to the output terminals 12 and 13 which are connected to load L with input impedance $z_b$.

Figure 3:
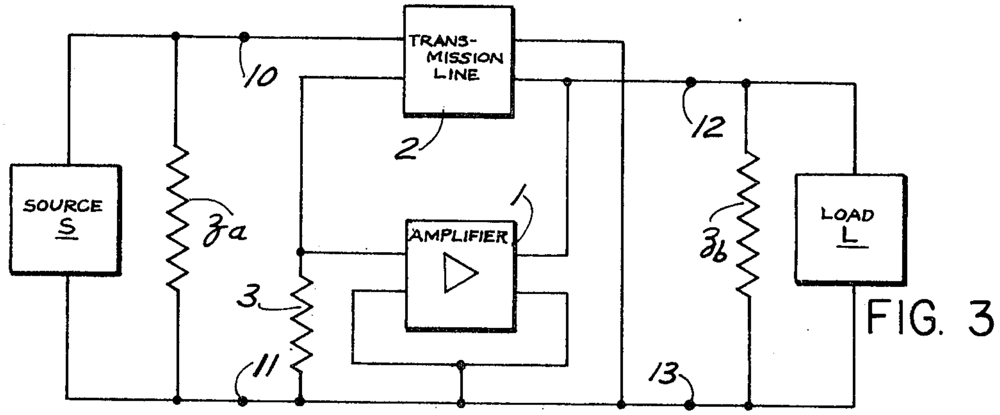
FIG. 3 is a diagram showing the amplifier element and the transmission line connected in a series-parallel; connection.

In FIG. 3, which shows a third embodiment of the amplifier circuit, the amplifier element 1 and the transmission line 2 are connected in a series-parallel connection. The amplification factor $K_{21}$ is obtained by adding the hybrid matrices of the transmission line and the amplifier, and transforming this sum hybrid matrix to the corresponding impedance matrix. The hybrid parameters of the transmission line are chosen in such a way, that the derivative of amplification factor $K_{21}$ with respect to parameter $z_{21f}$ will be zero at the operating point.

The type of circuit and the length and the characteristic impedance of the transmission line are thus chosen with regard to the active parameter of the amplifier element ($z_{21f}$, $y_{21f}$ and $h_{21f}$, respectively), so that the desired properties are obtained at a desired frequency. In order to achieve still better results a frequency dependent impedance can also be connected in circuit, this then being chosen so that said properties are obtained. The impedance can be connected to the input or the output of the amplifier element and there it can be connected in series or in parallel. In FIG. 3, it is shown how such an impedance 3 is connected in parallel to the input of the amplifier element.

The amplifier elements can be vacuum tubes or transistors. The active parameter known in the prior art in the case of transistors consists in most cases of the parameter $h_{21}$. The amplication stage, in accordance with any of the embodiments shown, can be connected to loads without connecting transformers or coils to the input and the output terminals. Such loads can, with advantage, be of the low ohmic resistance type.

It should be noted that the term lossless transmission line has been employed. While ideally, lossless transmission lines may not be realized in practice, practical transmission lines can be made to approximate ideally lossless transmission lines within the required tolerances of the circuits. Therefore, in practice substantially lossless transmission lines would be employed. Such lines can be formed from printed circuit techniques.

What is claimed is:

1. An amplifier circuit having an impedance matrix $$\begin{pmatrix}Z_{11}Z_{12}\\Z_{21}Z_{22}\end{pmatrix}$$

for connection between a source having an impedance $Z_a$ and a load having an impedance $Z_b$, said amplifier circuit comprising:

first and second input terminals connected to said source and first and second output terminals connected to said load;

at least one amplifier device having first and second input terminals and first and second output terminals, said amplifier device having the signal transfer matrix $$\begin{pmatrix} A_{11} A_{12} \\ A_{21} A_{22} \end{pmatrix}$$

wherein one of the elements $A_{ij}$ is active and determines the amplification of the amplifier device and is dependent on frequency and environment;

a transmission line which is substantially lossless and having first and second input terminals and first and second output terminals, said transmission line having the approximate impedance matrix $$\begin{pmatrix} -jZ_0 \cot \phi - jZ_0 \frac{1}{\sin} \phi \\ -jZ_0 \frac{1}{\sin} \phi - jZ_0 \cot \phi \end{pmatrix}$$

where $Z_0$ is the characteristic impedance of said transmission line and $\phi$ is the electrical length of the line;

means for connecting at least one input terminal of said amplifier device to one of the input terminals of said circuit;

means for connecting at least one output terminal of said amplifier device to one of the output terminals of said circuit;

means for connecting at least one input terminal of said transmission line to the other of the input terminals of said circuit;

means for connecting at least one output terminal of said transmission line to the other of the output terminals of said circuit;

means for connecting one of the input terminals of said amplifier device to one of the input terminals of said transmission line; and means for connecting one of the output terminals of said amplifier device to one of the output terminals of said transmission line;

said parameters $Z_0$ and $\phi$ of said transmission line be chosen such that the amplifier circuit's amplification $$K_{21} = \frac{4Z_a Z_b Z_{21}^2}{[(Z_{11}+Z_a)(Z_{22}+Z_b) - Z_{12}Z_{21}]^2}$$

when differentiated with respect to the active element $A_{ij}$ of the amplifier device is zero at the operating point of the amplifier device.

2. The amplifier circuit of claim 1 wherein the first input terminal of said amplifier device is connected to the first input terminal of said amplifier circuit, the first output terminal of said amplifier device is connected to the first output terminal of said amplifier circuit, the second input terminal of said transmission line is connected to the second input terminal of said amplifier circuit, the second output terminal of said transmission line is connected to the second output terminal of said amplifier device, the first input and first output terminals of said transmission line being connected to the second input and second output terminals of said amplifier device respectively, and the first input and first output terminals of said amplifier circuit being connected together so that said amplifier device and said transmission line are connected in series, and wherein the signal transfer matrix of said amplifier device is the impedance matrix.

$$\begin{pmatrix} Z_{11} Z_{12} \\ Z_{21} Z_{22} \end{pmatrix}$$

such that the impedance matrix of the amplifier circuit is the matrix sum of the impedance matrix of the amplifier device and the impedance matrix of the transmission line and wherein the active element is the impedance matrix element $Z_{11}$ of said amplifier device.

3. The amplifier circuit of claim 1 wherein the first input terminals of said amplifier device and said transmission line are connected to the first input terminal of said amplifier circuit, the second input terminals of said amplifier device and said transmission line are connected to the second input terminal of said amplifier circuit, the first output terminals of said amplifier device and said transmission line are connected to the first output terminal of said amplifier circuit, the second output terminals of said amplifier device and said transmission line are connected to the second output terminal of said amplifier circuit, and the first input and first output terminals of said amplifier circuit are interconnected so that said amplifier device and said transmission are connected in parallel, and wherein the signal transfer matrix of said amplifier device is the impedance matrix $$\begin{pmatrix} Z_{11} Z_{12} \\ Z_{21} Z_{22} \end{pmatrix}$$

such that the impedance matrix of the amplifier circuit is the sum of the admittance matrices of the amplifier device and the transmission line deriped from their admittance matrices, respectively, and then transformed from an admittance matrix to an impedance matrix and wherein the active element is the impedance matrix element $Z_{11}$ of said amplifier device.

4. The amplifier circuit of claim 1 wherein the first input terminal of said transmission line and the second input terminal of said amplifier device are connected to tthe first input terminal of said amplifier circuit, the second input terminal of said transmission line is connected to the second input terminal of said amplifier circuit, the first input terminal of said amplifier device is connected to the first input terminal of said amplifier circuit, the second output terminal of said transmission line and the first output terminal of said amplifier device are connected to the first output terminal of said amplifier circut, the first output terminal of said transmission line and the second output terminal of said amplifier device are connected to the second output terminal of said amplifier circuit, and the first input terminal and the first output terminal of said amplifier circuit are interconnected so that the amplifier device and said transmission line are connected in series parallel relation, and wherein the signal transfer matrix of said amplifier device is the impedance matrix $$\begin{pmatrix} Z_{11} Z_{12} \\ Z_{21} Z_{22} \end{pmatrix}$$

such that the impedance matrix is the sum of the hybrid matrices of the amplifier device and the transmission line derived from their impedance matrices, respectively, and then transformed from a hybrid matrix to an impedance matrix and wherein the active element is the impedance matrix element $Z_{11}$ of the amplifier device.

References Cited

UNITED STATES PATENTS

| | | | |
|---|---|---|---|
| 2,817,822 | 12/1957 | Meyers | 330—80 |
| 3,204,048 | 8/1965 | De Monte | 330—80 X |

NATHAN KAUFMAN, Primary Examiner

U.S. Cl. X.R.

330—75